US011637026B2

(12) United States Patent
Masutomi et al.

(10) Patent No.: US 11,637,026 B2
(45) Date of Patent: Apr. 25, 2023

(54) SUBSTRATE LIQUID PROCESSING APPARATUS

(71) Applicant: Tokyo Electron Limited, Tokyo (JP)

(72) Inventors: Hiroyuki Masutomi, Koshi (JP); Takashi Ikeda, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 360 days.

(21) Appl. No.: 16/150,513

(22) Filed: Oct. 3, 2018

(65) Prior Publication Data

US 2019/0103294 A1 Apr. 4, 2019

(30) Foreign Application Priority Data

Oct. 4, 2017 (JP) .............................. JP2017-194319

(51) Int. Cl.
*H01L 21/67* (2006.01)
*H01L 21/677* (2006.01)

(52) U.S. Cl.
CPC .... *H01L 21/67086* (2013.01); *H01L 21/6719* (2013.01); *H01L 21/67173* (2013.01); *H01L 21/67754* (2013.01)

(58) Field of Classification Search
CPC .......... H01L 21/67068; H01L 21/0217; H01L 21/47537; H01L 21/6708; H01L 21/67253; H01L 21/31111; H01L 21/67057; H01L 21/6704; H01L 21/67063; H01L 21/67075; H01L 21/6719; H01L 21/67017–67086; H01L 21/67173; H01L 21/67754
See application file for complete search history.

(56) References Cited

U.S. PATENT DOCUMENTS

| 5,503,171 A | * | 4/1996 | Yokomizo | ......... H01L 21/67057 |
| | | | | 134/182 |
| 5,887,602 A | * | 3/1999 | Iwama | ..................... B08B 3/00 |
| | | | | 134/43 |
| 6,398,904 B1 | * | 6/2002 | Heo | .................. H01L 21/67086 |
| | | | | 156/345.11 |

(Continued)

FOREIGN PATENT DOCUMENTS

| JP | H09-181041 A | 7/1997 |
| JP | H10-229067 A | 8/1998 |

(Continued)

*Primary Examiner* — Benjamin Kendall
*Assistant Examiner* — Kurt Sweely
(74) *Attorney, Agent, or Firm* — Pearne & Gordon LLP

(57) ABSTRACT

A substrate liquid processing apparatus includes an inner tub 34A having a top opening and storing a processing liquid therein; an outer tub 34B provided outside the inner tub; a first cover body 71 configured to move between a closing position where a first region of the top opening is closed and an opening position where the first region is opened; and a second cover body 72 configured to move between a closing position where a second region of the top opening is closed and an opening position where the second region is opened. The first cover body has a bottom wall 711R and a sidewall 712R extended upwards therefrom, and the second cover body has a bottom wall 721R and a sidewall 722R extended upwards therefrom. Further, when being placed at the closing positions, the sidewalls closely face each other with a gap G having a height H.

12 Claims, 8 Drawing Sheets

(56) References Cited

U.S. PATENT DOCUMENTS

| | | | |
|---|---|---|---|
| 6,613,692 | B1* | 9/2003 | Toshima ........... H01L 21/67057 438/719 |
| 7,722,441 | B2* | 5/2010 | Goela ................. C23C 16/4581 451/63 |
| 2002/0058423 | A1* | 5/2002 | Heo ................... H01L 21/67086 438/745 |
| 2006/0024213 | A1* | 2/2006 | Arai ................. H01L 21/67057 422/129 |
| 2006/0118140 | A1* | 6/2006 | Nishimura ................ B08B 3/10 134/34 |
| 2018/0090346 | A1* | 3/2018 | Sugioka ............ H01L 21/30604 |
| 2018/0218924 | A1* | 8/2018 | Tanaka .............. H01L 21/67757 |

FOREIGN PATENT DOCUMENTS

| | | |
|---|---|---|
| JP | H11-102888 A | 4/1999 |
| JP | H11-192459 A | 7/1999 |
| JP | 2006-041253 A | 2/2006 |

* cited by examiner

SUBSTRATE LIQUID PROCESSING APPARATUS

CROSS-REFERENCE TO RELATED APPLICATION

This application claims the benefit of Japanese Patent Application No. 2017-194319 filed on Oct. 4, 2017, the entire disclosures of which are incorporated herein by reference.

TECHNICAL FIELD

The various aspects and embodiments described herein pertain generally to a substrate liquid processing apparatus configured to perform a liquid processing on a substrate by using a processing liquid.

BACKGROUND

A manufacturing process for a semiconductor device includes a silicon nitride film etching process of wet-etching a silicon nitride film formed on a surface of a substrate such as a semiconductor wafer by immersing the substrate in a phosphoric acid aqueous solution stored in a processing tub.

A liquid processing apparatus for use in this wet-etching is equipped with, for example, an inner tub configured to store therein a processing liquid (phosphoric acid aqueous solution); an outer tub configured to receive the processing liquid overflown from the inner tub; and a circulation line and a circulation pump configured to circulate the processing liquid such that the processing liquid discharged from the outer tub is returned back into the inner tub The phosphoric acid aqueous solution within the inner tub is maintained in a boiling state. For this reason, whenever bubbles generated by boiling reaches a liquid surface, spray of the phosphoric acid aqueous solution is generated to be scattered around the inner tub. If this spray of the phosphoric acid aqueous solution is scattered to the outside of the outer tub, environment around the processing tub may be contaminated. Further, as the processing liquid comes out of a circulation system, it may be difficult to manage components of the processing liquid.

Patent Documents 1 and 2 describe a configuration with a pair of cover bodies (called an "auto cover" in Patent Documents 1 and 2) configured to be opened only when the substrate is carried in or out to suppress the phosphoric acid aqueous solution from being scattered around the processing tub. The Patent Documents 1 and 2, however, do not explain any specific configuration of the cover body, which is merely described as a schematically rectangular object.

Patent Document 1: Japanese Patent Laid-open Publication No. H09-181041

Patent Document 2: Japanese Patent Laid-open Publication No. 2006-041253

SUMMARY

In view of the foregoing, exemplary embodiments provide a substrate liquid processing apparatus equipped with a cover body structure capable of preventing or effectively suppressing a boiling processing liquid from being splashed from a processing tub to be put on a cover body or being scattered to the outside of the cover body.

In one exemplary embodiment, a substrate liquid processing apparatus includes an inner tub, having a top opening, configured to store a processing liquid therein; an outer tub provided at an outside of the inner tub and configured to receive the processing liquid flown from the inner tub; a first cover body configured to be moved between a closing position where the first cover body closes a first region of the top opening of the inner tub and an opening position where the first cover body opens the first region of the top opening; and a second cover body configured to be moved between a closing position where the second cover body closes a second region of the top opening of the inner tub and an opening position where the second cover body opens the second region of the top opening. The first cover body has a bottom wall and a sidewall extended upwards from the bottom wall, and the second cover body has a bottom wall and a sidewall extended upwards from the bottom wall. Further, when the first cover body and the second cover body are respectively placed at the closing positions, the sidewall of the first cover body and the sidewall of the second cover body are closely located to face each other with a gap having a height therebetween.

Recently, the present applicant has examined the way to improve controllability over a temperature and a boiling state of the processing liquid within the processing tub by bringing the cover body into contact with the phosphoric acid aqueous solution within the processing tub. If the cover body is into contact with the processing liquid, there is a high likelihood that the phosphoric acid aqueous solution splashes out from a slight gap between the processing tub and the cover body even if the cover body is provided at the processing tub. According to the exemplary embodiment, when the cover body is provided at the processing tub, it is possible to suppress the spray of the phosphoric acid aqueous solution from being splashed to the outside of the cover body even when the cover body is in contact with the processing liquid as well as when the cover body is not in contact with the processing liquid.

According to the exemplary embodiments, the processing liquid can be prevented or greatly suppressed from splashing out from the gap between the first cover body and the second cover body.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
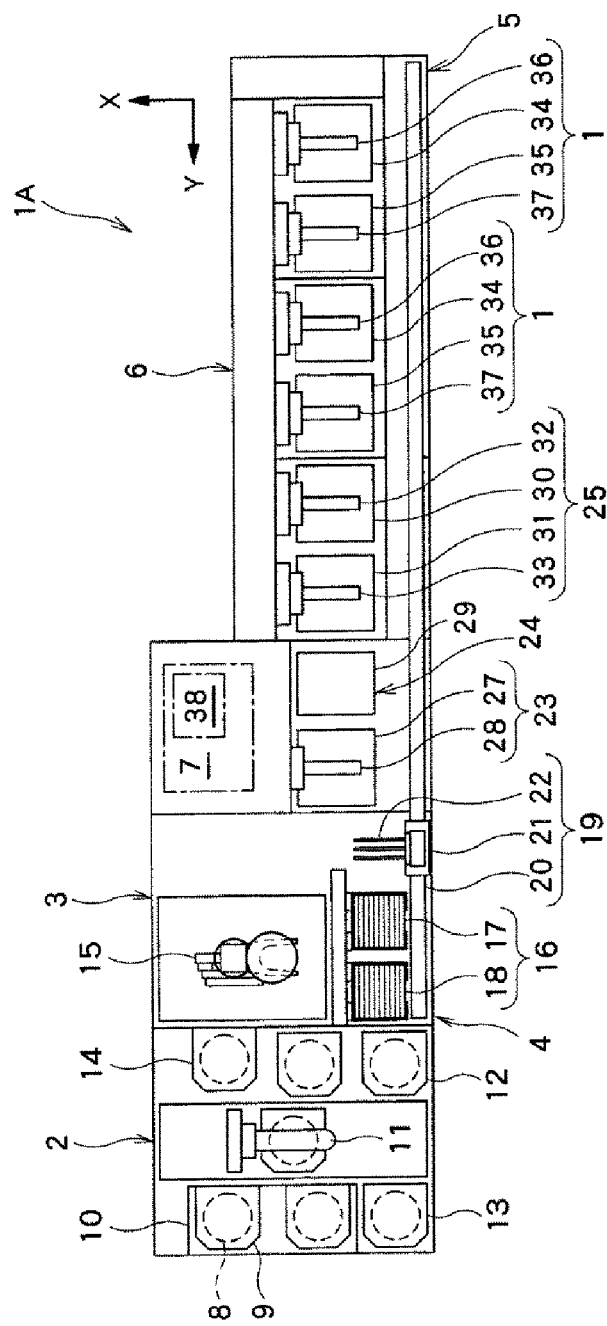
FIG. 1 is a schematic plan view illustrating an overall configuration of a substrate liquid processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. First, an overall substrate liquid processing system 1A equipped with a substrate liquid processing apparatus 1 according to an exemplary embodiment will be discussed.

As depicted in FIG. 1, the substrate liquid processing system 1A includes a carrier carry-in/out unit 2, a lot forming unit 3, a lot placing unit 4, a lot transferring unit 5, a lot processing unit 6 and a control unit 7.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture.

The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table 14 configured to place the carrier 9 thereon. Here, the carrier stock 12 temporarily accommodates therein the substrates 8 to be produced as products before the substrates 8 are processed by the lot processing unit 6. Further, the carrier stock 13 temporarily accommodates therein the substrates 8 to be produced as the products after the substrates 8 are processed by the lot processing unit 6.

The carrier carry-in/out unit 2 transfers the carrier 9, which is carried onto the carrier stage 10 from the outside, to the carrier stock 12 or the carrier placing table 14 by using the carrier transfer device 11. Further, the carrier carry-in/out unit 2 transfers the carrier 9 placed on the carrier placing table 14 to the carrier stock 13 or the carrier stage 10 by using the carrier transfer device 11. The carrier 9 transferred onto the carrier stage 10 is carried to the outside.

By combining substrates 8 accommodated in one or more carriers 9, the lot forming unit 3 forms a lot composed to a multiplicity (e.g., 50 sheets) of substrates 8 which are processed at the same time. When forming the lot, the substrates 8 may be arranged such that surfaces thereof having patterns formed thereon face each other or such that the surfaces thereof having the patterns formed thereon all face to one direction.

The lot forming unit 3 is equipped with the substrate transfer device 15 configured to transfer a plurality of substrates 8. The substrate transfer device 15 is capable of changing a posture of the substrates 8 from the horizontal posture to a vertical posture and from the vertical posture to the horizontal posture while transferring the substrates 8.

The lot forming unit 3 transfers the substrates 8 to the lot placing unit 4 from the carrier 9 placed on the carrier placing table 14 by using the substrate transfer device 15 and places the substrates 8 belonging to the lot in the lot placing unit 4. Further, the lot forming unit 3 transfers the lot placed in the lot placing unit 4 to the carrier 9 placed on the carrier placing table 14 by using the substrate transfer device 15. Further, the substrate transfer device 15 is equipped with, as a substrate supporting unit configured to support the multiplicity of substrates 8, two types of substrate supporting units: a before-processed substrate supporting unit configured to support the substrates 8 before being processed (before being transferred to the lot transferring unit); and an after-processed substrate supporting unit configured to support the substrates 8 after being processed (after being transferred to the lot transferring unit 5). Accordingly, particles or the like adhering to the substrates 8 before being processed may be suppressed from adhering to the substrates 8 after being processed.

In the lot placing unit 4, the lot which is transferred between the lot forming unit 3 and the lot processing unit 6 by the lot transferring unit 5 is temporarily placed (stands by) on the lot placing table 16.

The lot placing unit 4 is equipped with: a carry-in side lot placing table 17 configured to place thereon the lot before being processed (before being transferred to the lot transferring unit 5); and a carry-out side lot placing table 18 configured to place thereon the lot after being processed (after being transferred to the lot transferring unit 5). On each of the carry-in side lot placing table 17 and the carry-out side lot placing table 18, the multiplicity of substrates 8 corresponding to the single lot are arranged in a forward-backward direction with the vertical posture.

In the lot placing unit 4, the lot formed in the lot forming unit 3 is placed on the carry-in side lot placing table 17, and this lot is carried into the lot processing unit 6 via the lot transferring unit 5. Further, in the lot placing unit 4, the lot carried out from the lot processing unit 6 via the lot transferring unit 5 is placed on the lot placing table 18, and this lot is transferred to the lot forming unit 3.

The lot transferring unit 5 is configured to transfer the lot between the lot placing unit 4 and the lot processing unit 6 and within the lot processing unit 6.

The lot transferring unit 5 is equipped with a lot transfer device 19 configured to transfer the lot. The lot transfer device 19 includes a rail 20 extended along the lot placing unit 4 and the lot processing unit 6; and a moving body 21 configured to be moved along the rail 20 while holding the multiplicity of substrates 8. The moving body 21 is provided with a substrate holding body 22 configured to hold the multiplicity of substrates 8 arranged in the forward-backward direction with the vertical posture.

The lot transferring unit 5 receives the lot placed on the carry-in side lot placing table 17 with the substrate holding body 22 of the lot transfer device 19 and delivers the received lot to the lot processing unit 6. Further, the lot transferring unit 5 receives the lot processed by the lot processing unit 6 with the substrate holding body 22 of the lot transfer device 19 and delivers the received lot to the carry-out side lot placing table 18. The lot transferring unit 5 transfers the lot within the lot processing unit 6 by using the lot transfer device 19.

The lot processing unit 6 is configured to perform a processing such as etching, cleaning and drying on the single lot composed of the multiplicity of substrates 8 arranged in the forward-backward direction with the vertical posture.

The lot processing unit 6 includes a drying apparatus 23 configured to perform a drying processing on the substrates 8; a substrate holding body cleaning apparatus 24 configured to perform a cleaning processing on the substrate holding body 22; a cleaning apparatus 25 configured to perform a cleaning processing on the substrates 8; and two etching apparatuses (substrate liquid processing apparatuses) 1 according to the exemplary embodiment, each of which is configured to perform an etching processing on the substrates 8.

The drying apparatus 23 is equipped with a processing tub 27; and a substrate elevating device 28 provided at the processing tub 27 and configured to be moved up and down. A processing gas for drying (IPA (isopropyl alcohol) or the like) is supplied into the processing tub 27. The substrate elevating device 28 holds the substrates 8 corresponding to the single lot while keeping the substrates 8 arranged in the forward-backward direction with the vertical posture. The drying apparatus 23 receives the lot from the substrate holding body 22 of the lot transfer device 19 by the substrate elevating device 28, and moves the received lot up and down by the substrate elevating device 28, so that a drying processing of the substrates 8 is performed with the processing gas for drying supplied into the processing tub 27. Further, the drying apparatus 23 delivers the lot to the substrate holding body 22 of the lot transfer device 19 from the substrate elevating device 28.

The substrate holding body cleaning apparatus 24 includes a processing tub 29 and is configured to supply a processing liquid for cleaning and a drying gas into this processing tub 29. By supplying the drying gas after supplying the processing liquid for cleaning to the substrate holding body 22 of the lot transfer device 19, a cleaning processing on the substrate holding body 22 is performed.

The cleaning apparatus 25 has a processing tub 30 for cleaning and a processing tub 31 for rinsing. The processing tub 30 for cleaning is equipped with a substrate elevating device 32 configured to be vertically movable, and the processing tub 31 for rinsing is equipped with a substrate elevating device 33 configured to be vertically movable. The processing tub 30 for cleaning stores therein a processing liquid for cleaning (SC-1 or the like). The processing tub 31 for rinsing stores therein a processing liquid for rinsing (pure water or the like).

The etching apparatus 1 has a processing tub 34 for etching and a processing tub 35 for rinsing. The processing tub 34 and the processing tub 35 are equipped with a substrate elevating device 36 and a substrate elevating device 37 configured to be vertically movable, respectively. The processing tub 34 for etching stores therein a processing liquid for etching (a phosphoric acid aqueous solution). The processing tub 35 for rinsing stores therein a processing liquid for rinsing (pure water or the like). As stated above, the etching apparatus 1 is configured as the substrate liquid processing apparatus according to the exemplary embodiment.

The cleaning apparatus 25 and the etching apparatus 1 have the same configuration. The etching apparatus (substrate liquid processing apparatus) 1 will be described. The multiple number of substrates 8 constituting the single lot are held by the substrate elevating device 36 while being arranged in the forward-backward direction with the vertical posture. In the etching apparatus 1, the substrate elevating device 36 receives the lot from the substrate holding body 22 of the lot transfer device 19, and the received lot is moved up and down by the substrate elevating device 36. Accordingly, the lot is immersed in the processing liquid for etching in the processing tub 34, so that an etching processing is performed on the substrates 8. Thereafter, the etching apparatus 1 delivers the lot to the substrate holding body 22 of the lot transfer device 19 from the substrate elevating device 36. Then, the lot is received by the substrate elevating device 37 from the substrate holding body 22 of the lot transfer device 19, and the received lot is moved up and down by the substrate elevating device 37. Accordingly, the lot is immersed in the processing liquid for rinsing in the processing tub 35, so that a rinsing processing is performed on the substrates 8. Thereafter, the lot is delivered to the substrate holding body 22 of the lot transfer device 19 from the substrate elevating device 37.

The control unit 7 controls operations of individual components (the carrier carry-in/out unit 2, the lot forming unit 3, the lot placing unit 4, the lot transferring unit 5, the lot processing unit 6 and the etching apparatus 1) of the substrate liquid processing system 1A.

The control unit 7 may be implemented by, for example, a computer and has a computer-readable recording medium 38. The recording medium 38 stores therein programs for controlling various types of processings performed in the substrate liquid processing apparatus 1. The control unit 7 controls the operation of the substrate liquid processing apparatus 1 by reading and executing the programs stored in the recording medium 38. Further, the programs are stored in the compute-readable recording medium 38 and may be installed to the recording medium 38 of the control unit 7 from another recording medium. The computer-readable recording medium 38 may be implemented by, by way of example, a hard disk HD, a flexible disk FD, a compact disk CD, a magnet optical disk MO, a memory card, or the like.

As stated above, in the processing tub 34 of the etching apparatus 1, a liquid processing (etching processing) is performed on the substrates 8 by using an aqueous solution (phosphoric acid aqueous solution) of a chemical (phosphoric acid) having a preset concentration.

Figure 2:
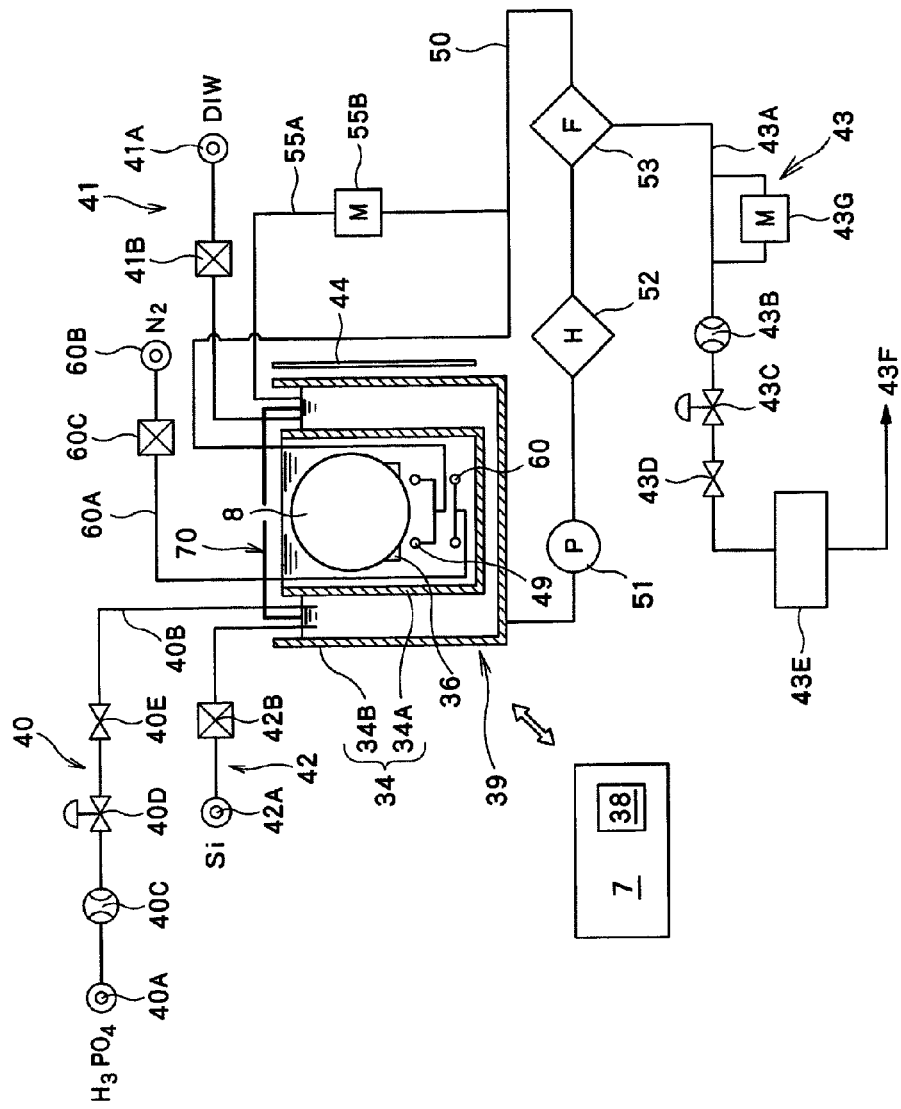
FIG. 2 is a schematic system diagram illustrating a configuration of an etching apparatus provided in the substrate liquid processing system.
Figure 3:
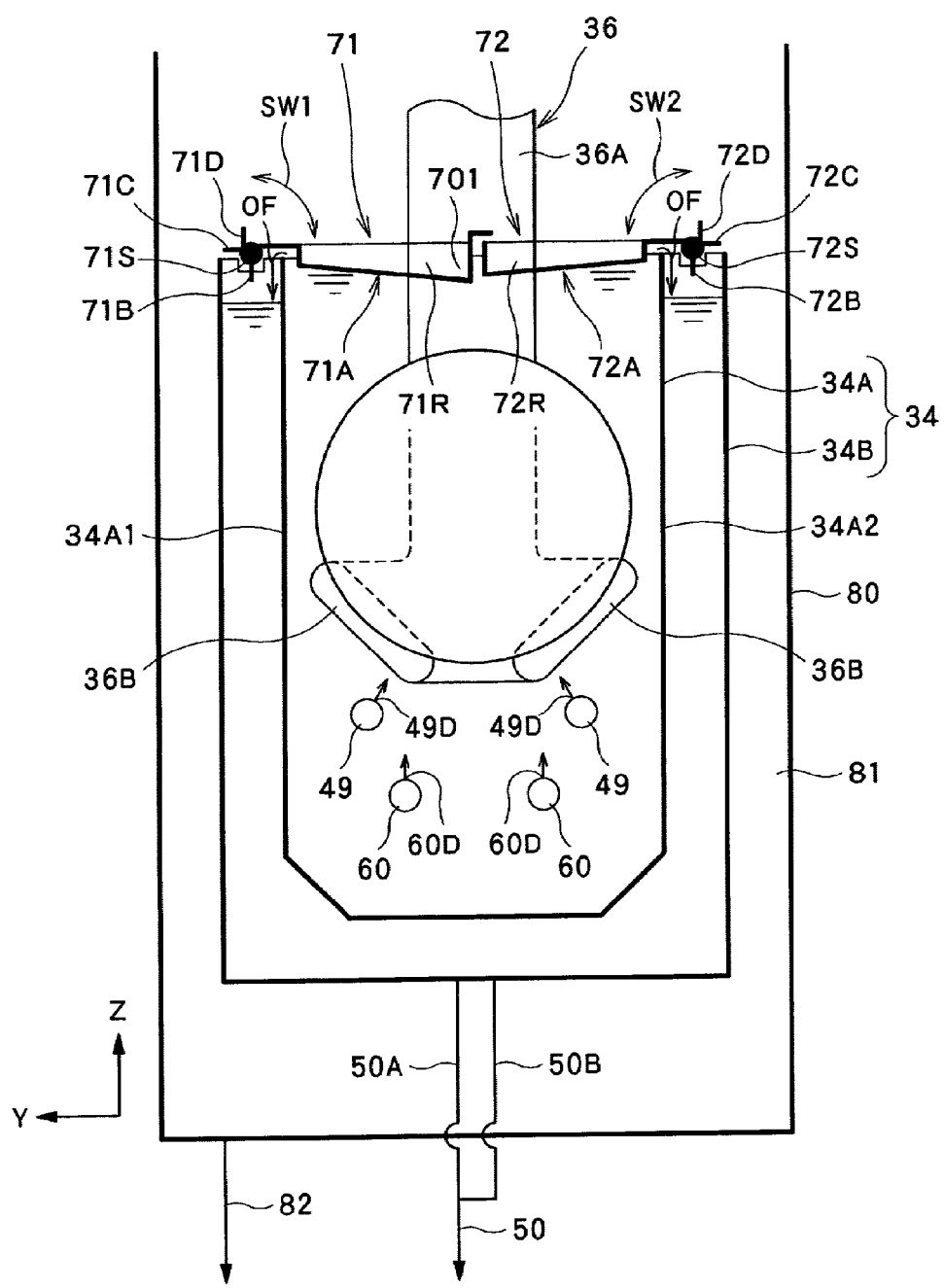
FIG. 3 is a schematic longitudinal sectional view of a processing tub of the etching apparatus.
Figure 4:
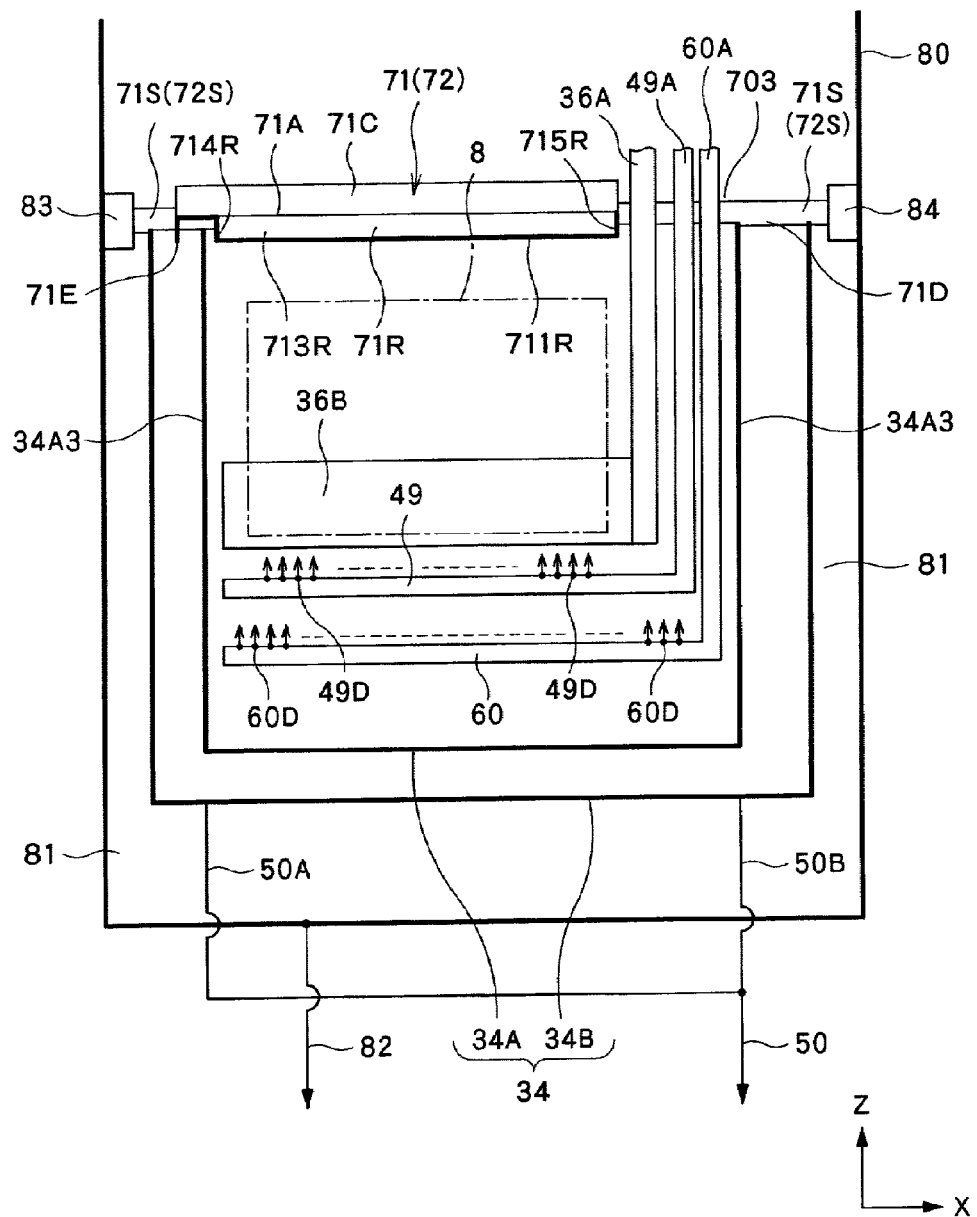
FIG. 4 is a longitudinal sectional view of the processing tub in a lengthwise direction thereof.
Figure 5:
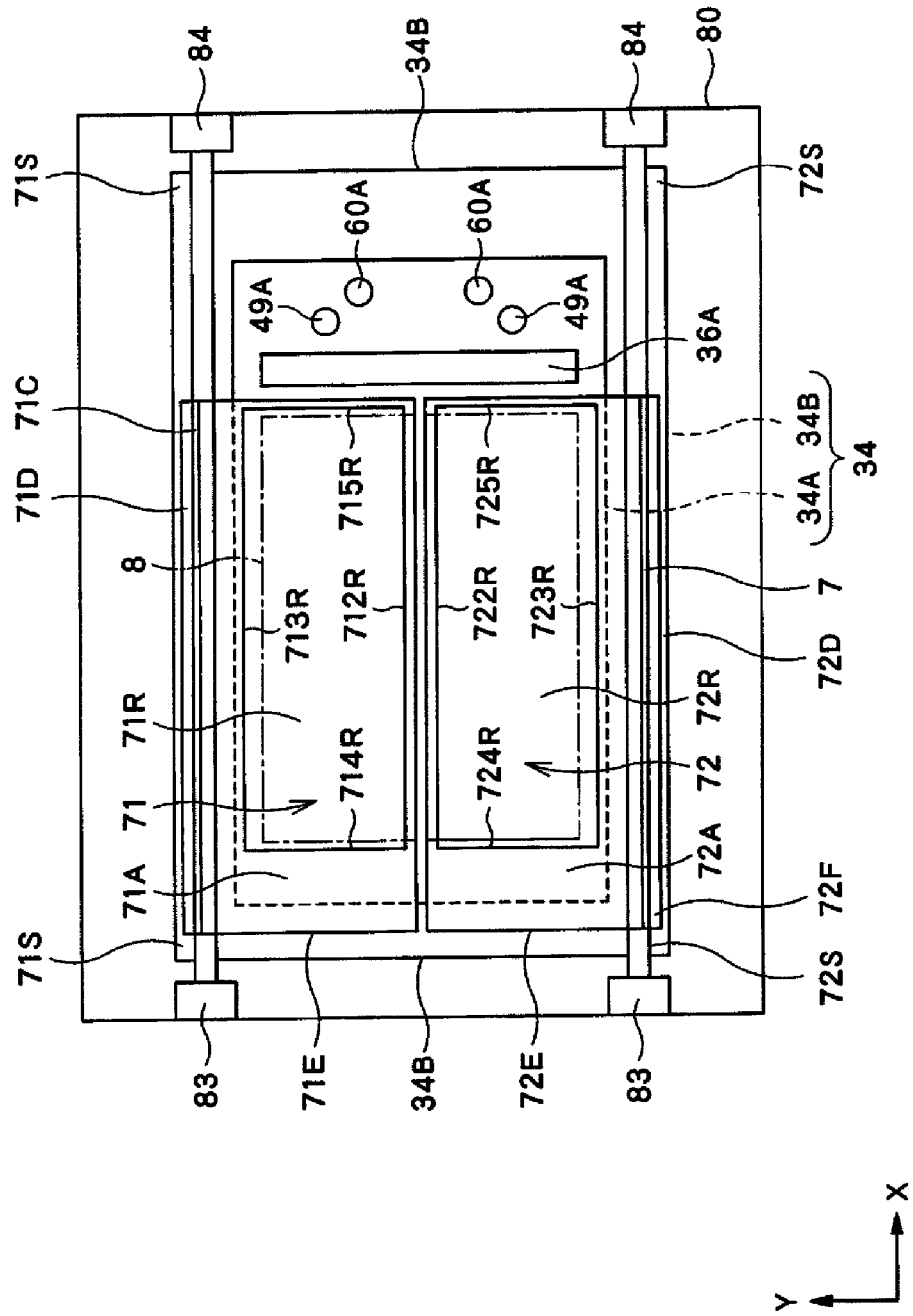
FIG. 5 is a schematic plan view of the processing tub.

Now, a schematic configuration of the etching apparatus (substrate liquid processing apparatus) 1 and a pipeline system will be explained with reference to FIG. 2.

The etching apparatus 1 is equipped with the aforementioned processing tub 34 for storing therein the phosphoric acid aqueous solution having the preset concentration as a processing liquid. The processing tub 34 has an inner tub 34A and an outer tub 34B. The phosphoric acid aqueous solution overflown from the inner tub 34 is introduced into the outer tub 34B. A liquid level of the outer tub 34B is maintained lower than a liquid level of the inner tub 34A.

An upstream end of a circulation line 50 is connected to a bottom of the outer tub 34B. A downstream end of the circulation line 50 is connected to a processing liquid supply nozzle 49 provided within the inner tub 34A. The circulation line 50 is provided with a pump 51, a heater 52 and a filter 53 in sequence from the upstream side. By driving the pump 51, a circulation flow of the phosphoric acid aqueous solution, which is sent from the outer tub 34B into the inner tub 34A via the circulation line 50 and the processing liquid supply nozzle 49 and then flown out from the inner tub 34A into the outer tub 34B again, is generated.

A liquid processing unit 39 is formed by the processing tub 34, the circulation line 50 and devices 51, 52, 53, etc., within the circulation line 50. Further, the processing tub 34 and the circulation line 50 constitutes a circulation system.

Provided below the processing liquid supply nozzle 49 within the inner tub 34A is a gas nozzle 60 configured to discharge air bubbles (that is, perform bubbling) of an inert gas, for example, a nitrogen gas in the phosphoric acid aqueous solution within the inner tub 34A. The inert gas such as the nitrogen gas is supplied to the gas nozzle 60 via a flow rate controller 60C composed of an opening/closing valve, a flow rate control valve, a flowmeter, and the like.

The processing tub 34 is further equipped with the aforementioned substrate elevating device 36. The substrate elevating device 36 is capable of holding the multiplicity of substrates 8 such that the substrates 8 are arranged with the vertical posture at a regular interval therebetween in the horizontal direction, and is also capable of being moved up and down in this state.

The etching apparatus 1 is equipped with a phosphoric acid aqueous solution supply unit 40 configured to supply the phosphoric acid aqueous solution into the liquid processing unit 39; a pure water supply unit 41 configured to supply pure water into the liquid processing unit 39; a silicon supply unit 42 configured to supply a silicon solution into the liquid processing unit 39; and a phosphoric acid aqueous solution drain unit 43 configured to drain the phosphoric acid aqueous solution from the liquid processing unit 39.

The phosphoric acid aqueous solution supply unit 40 is configured to supply the phosphoric acid aqueous solution of a preset concentration to some places within the circulation system composed of the processing tub 34 and the circulation line 50, desirably, into the outer tub 34B as illustrated. The phosphoric acid aqueous solution supply unit 40 is equipped with a phosphoric acid aqueous solution source 40A implemented by a tank configured to store the phosphoric acid aqueous solution therein; a phosphoric acid aqueous solution supply line 40B configured to connect the phosphoric acid aqueous solution source 40A and the outer tub 34B; and a flowmeter 40C, a flow rate control valve 40D and an opening/closing valve 40E provided at the phosphoric acid aqueous solution supply line 40B in sequence from the upstream side thereof. The phosphoric acid aqueous solution supply unit 40 is capable of supplying the phosphoric acid aqueous solution into the outer tub 34B at a controlled flow rate via the flowmeter 40C and the flow rate control valve 40D.

The pure water supply unit 41 is configured to supply the pure water to replenish moisture that has evaporated as the phosphoric acid aqueous solution is heated. This pure water supply unit 41 includes a pure water source 41A configured to supply the pure water of a preset temperature, and this pure water source 41A is connected to the outer tub 34B via a flow rate controller 41B. The flow rate controller 41B may be composed of an opening/closing valve, a flow rate control valve, a flowmeter, and the like.

The silicon supply unit 42 is equipped with a silicon source 42A implemented by a tank configured to store therein a silicon-containing compound solution such as, but not limited to, a liquid in which colloidal silicon is dispersed; and a flow rate controller 42B. The flow rate controller 42B may be composed of an opening/closing valve, a flow rate control valve, a flowmeter, and the like.

The phosphoric acid aqueous solution drain unit 43 is configured to drain the phosphoric acid aqueous solution within the circulation system composed of the liquid processing unit 39 and the circulation line 50, that is, within the liquid processing unit 39. The phosphoric acid aqueous solution drain unit 43 is equipped with a drain line 43A branched from the circulation line 50; a flowmeter 43B, a flow rate control valve 43C and an opening/closing valve 43D provided at the drain line 43A in sequence from the upstream side thereof; and a cooling tank 43E. The phosphoric acid aqueous solution drain unit 43 is capable of draining the phosphoric acid aqueous solution at a controlled flow rate via the flowmeter 43B and the flow rate control valve 43C.

The cooling tank 43E temporarily stores and cools therein the phosphoric acid aqueous solution flown through the drain line 43A. The phosphoric acid aqueous solution flown out from the cooling tank 43E is wasted to a factory waste system (not shown) (as indicated by a reference numeral 43F) or may be sent into the phosphoric acid aqueous solution source 40A to be reused after the silicon contained in this phosphoric acid aqueous solution is removed by a reproducing apparatus (not shown).

In the shown example, the drain line 43A is connected to the circulation line 50 (in the drawing, at a position corresponding to a filter drain). However, the exemplary embodiment may not be limited thereto, and the drain line 43A may be connected to another position within the circulation system, for example, a bottom of the inner tub 34A.

The drain line 43A is equipped with a silicon concentration meter 43G configured to measure a silicon concentration within the phosphoric acid aqueous solution. Further, a branch line 55A branched from the circulation line 50 and connected to the outer tub 34B is provided with a phosphoric acid concentration meter 55B configured to measure a phosphoric acid concentration in the phosphoric acid aqueous solution. Further, the outer tub 34B is equipped with a liquid level meter 44 configured to detect the liquid level within the outer tub 34B.

Now, refereeing to FIG. 3 to FIG. 7, a configuration of the processing tub 34 of the etching apparatus 1 will be described in detail. For the convenience of explanation, an XYZ orthogonal coordinates system will be set and referred to when necessary. Further, the negative X direction may sometimes be referred to as "front side" or "front direction"; the positive X direction, "rear side" or "rear direction"; the negative Y direction, "right side" or "right direction"; the positive Y direction, "left side" or "left direction".

As stated above, the processing tub 34 includes the inner tub 34A having a top opening; and the outer tub 34B having a top opening. The inner tub 34A is accommodated in the outer tub 34B. The phosphoric acid aqueous solution flown out from the inner tub 34A is flown into the outer tub 34B. While a liquid processing is being performed, most of the inner tub 34A including the bottom thereof is immersed in the phosphoric acid aqueous solution within the outer tub 34B.

The outer tub 34B is accommodated in a liquid receptacle (sink) 80, and a drain space 81 is formed between the outer tub 34B and the liquid receptacle 80. A drain line 82 is connected to a bottom portion of the drain space 81.

The processing liquid supply nozzle 49 is implemented by a cylindrical body extended in the X direction (horizontal direction) within the inner tub 34A. The processing liquid supply nozzle 49 is configured to discharge the processing liquid toward the substrates 8 held by the substrate elevating device 36 from a multiple number of discharge openings 49D (see FIG. 3 and FIG. 4) bored at a peripheral surface thereof. Though two processing liquid nozzles 49 are illustrated in the drawing, it may be possible to provide more than two processing liquid nozzles 49. The processing liquid (phosphoric acid aqueous solution) is supplied into the processing liquid supply nozzles 49 from a pipeline 49A extended in the vertical direction.

The gas nozzle 60 is implemented by a cylindrical body extended in the X direction (horizontal direction) at a height position lower than the processing liquid supply nozzle 49 within the inner tub 34A. The gas nozzle 60 is configured to discharge air bubbles of the inert gas (for example, the nitrogen gas) from discharge openings 60D bored at a peripheral surface thereof. A boiling state of the phosphoric acid aqueous solution within the inner tub 34A can be stabilized by bubbling of the inert gas. The inert gas is supplied into the gas nozzle 60 from a pipeline 60A extended in the vertical direction.

The substrate elevating device 36 is equipped with a supporting plate 36A extended in the vertical direction (Z direction) and configured to be moved up and down by a non-illustrated elevating device; and a pair of substrate supporting members 36B extended in the horizontal direction (X direction) while one ends thereof are supported by the supporting plate 36A. Each substrate supporting member 36B is provided with a multiple number of (for example, 50 to 52) substrate supporting grooves (not shown) which are arranged with a gap therebetween in the horizontal direction (X direction). Peripheral portions of the substrates 8 are inserted in the substrate supporting grooves. The substrate elevating device 36 is capable of holding a multiple number of (for example, 50 to 52) substrates 8 with the vertical posture while maintaining the gap therebetween in the horizontal direction (X direction). As this substrate elevating device 36 is commonly known in the pertinent art, illustration and description of a detailed configuration thereof will be omitted here.

Figure 8:
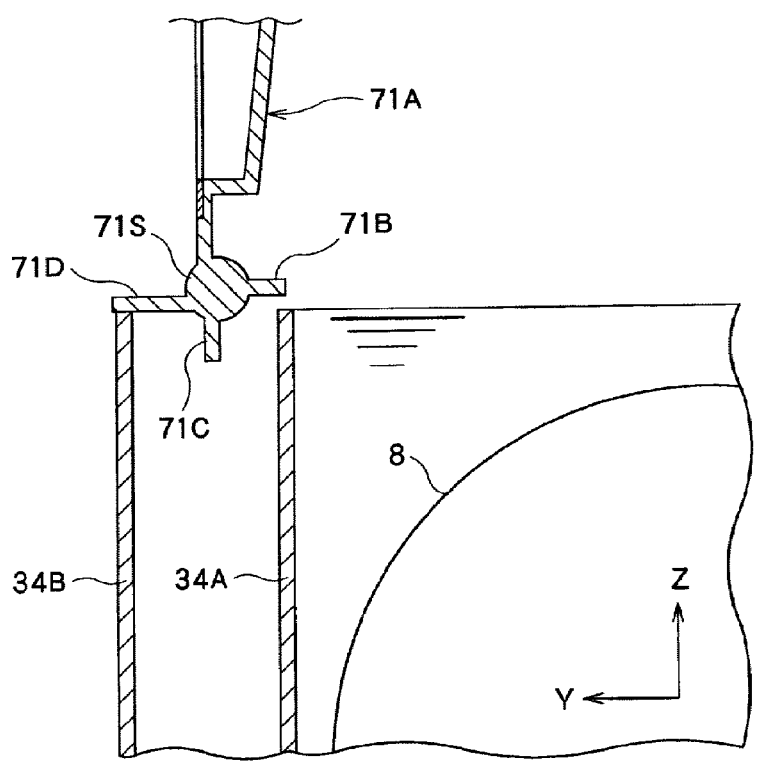
FIG. 8 is a longitudinal sectional view illustrating the cover body moved to an opening position from the closing position shown in FIG. 6.

The processing tub 34 is equipped with a first cover body 71 and a second cover body 72 configured to open or close the top opening of the inner tub 34A. The first cover body 71 and the second cover body 72 are respectively connected with rotation shafts 71S and 72S which are extended in the horizontal direction (X direction). The rotation shafts 71S and 72S are connected to a bearing 83 and a rotation actuator 84 (see FIG. 4 and FIG. 5) fixed to the liquid receptacle 80. By operating the rotation actuator 84, the first cover body 71 and the second cover body 72 can be rotated (revolved) around respective rotation axes extended in the horizontal direction (X direction) between closing positions (shown in FIG. 3 and FIG. 6) where the first cover body and the second cover body close a first region (left-half portion) and a second region (right-half portion) of the top opening of the inner tub 34A, respectively, and opening positions (shown in FIG. 8) where the first cover body and the second cover body are turned into a substantially upright state to open the first region and the second region of the top opening of the inner tub 34A (see arrows SW1 and SW2 in FIG. 3).

The first cover body 71 and the second cover body 72 do not cover a region of the top opening of the inner tub 34A where the supporting plate 36 and the pipelines 49A and 60A are provided.

In a typical operation of the etching apparatus 1, the first cover body 71 and the second cover body 72 are respectively located at the closing positions except when the carry-in/carry-out of the substrates 8 held by the substrate elevating device 36 with respect to the inner tub 34A is performed, so that a decrease of a temperature of the phosphoric acid aqueous solution within the inner tub 34A can be suppressed and vapor generated from the boiling phosphoric acid aqueous solution is also suppressed from leaking to the outside of the processing tub 34.

The first cover body 71 has a main body 71A having a substantially rectangular shape when viewed from directly above; a first spray shield member 71B, a second spray shield member 71C and a closing member 71D extended in the X direction; and a third spray shield member 71E extended in the Y direction. Likewise, the second cover body 72 has a main body 72A having a substantially rectangular shape; a first spray shield member 72B, a second spray shield member 72C and a closing member 72D extended in the X direction; and a third spray shield member 72E extended in the Y direction.

A large rectangular recess 71R is formed on a top surface of the main body 71A. The recess 71R is defined by a bottom wall 711R and four sidewalls 712R, 713R, 714R and 715R.

Not to interfere with an overflow (see an arrow OF in FIG. 6) of the phosphoric acid aqueous solution into the outer tub 34B from the inner tub 34A when the first cover body 71 is placed at the closing position, gaps are provided between sidewalls of the inner tub 34A and the sidewalls 713R which are adjacent to these sidewalls of the inner tub 34A, while facing them. Further, though not illustrated, V-shaped notches are formed at upper ends of four sidewalls of the inner tub 34A at a regular interval therebetween to allow the overflow to be performed smoothly.

The bottom wall 711R of the first cover body 71 is inclined to become higher as it is spaced apart from the second cover body 72 in the Y direction (that is, as it approaches the sidewall of the inner tub 34A in the Y direction). This inclination allows the aforementioned overflow to be performed smoothly.

Since the phosphoric acid aqueous solution within the inner tub 34A is in the boiling state, the spray of the phosphoric acid aqueous solution as well as the phosphoric acid aqueous solution overflown from the inner tub 34A into the outer tub 34B are splashed. This spray of the phosphoric acid aqueous solution collides with the first spray shield member 71B of the first cover body 71 placated at the closing position, and, then, falls in a space between the sidewall of the inner tub 34A and the sidewall of the outer tub 34B without being scattered to the outside of the outer tub 34B. It is desirable that a lower end of the first spray shield member 71B of the first cover body 71 located at the closing position is at least lower than an upper end of the adjacent sidewall of the inner tub 34A.

When the first cover body 71 is placed at the opening position, the second spray shield member 71C performs the same function as the first spray shield member 71B when the first cover body 71 is placed at the closing position. Desirably, the lower end of the second spray shield member 71C of the first cover body 71 located at the opening position is at least lower than the upper end of the adjacent sidewall of the inner tub 34A.

The closing member 71D closes, in the gap between the upper end of the sidewall of the inner tub 34A and the upper end of the sidewall of the outer tub 34B, a region from the rotation shaft 71S to the sidewall of the outer tub 34B. The closing member 71D guides a liquid having adhered to the top surface of the main body 71A when the first cover body 71 is placed at the closing position (for example, a liquid having fallen from the wet substrate when this substrate passes through a space above the processing tub 34) into the drain space 81 between the outer tub 34B and the liquid receptacle 80 to suppress this liquid from being flown into the outer tub 34B. The liquid having reached the drain space 81 is wasted through the drain line 82.

At a side far from the substrate elevating device 36, the third spray shield member 71E is extended above a space between the sidewall of the inner tub 34A and the sidewall of the outer tub 34. The third spray shield member 71E is extended from the rotation axis 71S in the Y direction along the entire edge of the first cover body 71. When the first cover body 71 is located at the closing position, the third spray shield member 71E performs the same function as the first spray shield member 71B. Desirably, a lower end of the third spray shield member 71E of the first cover body 71 placed at the closing position is located at least lower than the upper end of the adjacent sidewall of the inner tub 34A.

A spray shield member extended along the edge of the first cover body 71 in the Y direction need not be provided at a side close to the substrate elevating device 36. It is because the phosphoric acid aqueous solution splashed in the positive X direction collides with the supporting plate 36A of the substrate elevating device 36, the pipelines 49A and 60A, and so forth, so that most of this phosphoric acid aqueous solution does not reach the outer tub 34B.

The second cover member 72 is formed mirror-symmetrically with respect to the first cover body 71, and the first cover body 71 and the second cover body 72 have a substantially same structure. Accordingly, the description of the configuration and the operation of the first cover body 71 can be applied to a description of a configuration and an operation of the second cover body 72. Corresponding members (members at corresponding positions, members having same function, etc.) of the first cover body 71 and the second cover body 72 are assigned same alphabets at the end of reference numerals with an only difference in the first two numbers of the reference numerals being "71" or "72".

Figure 6:
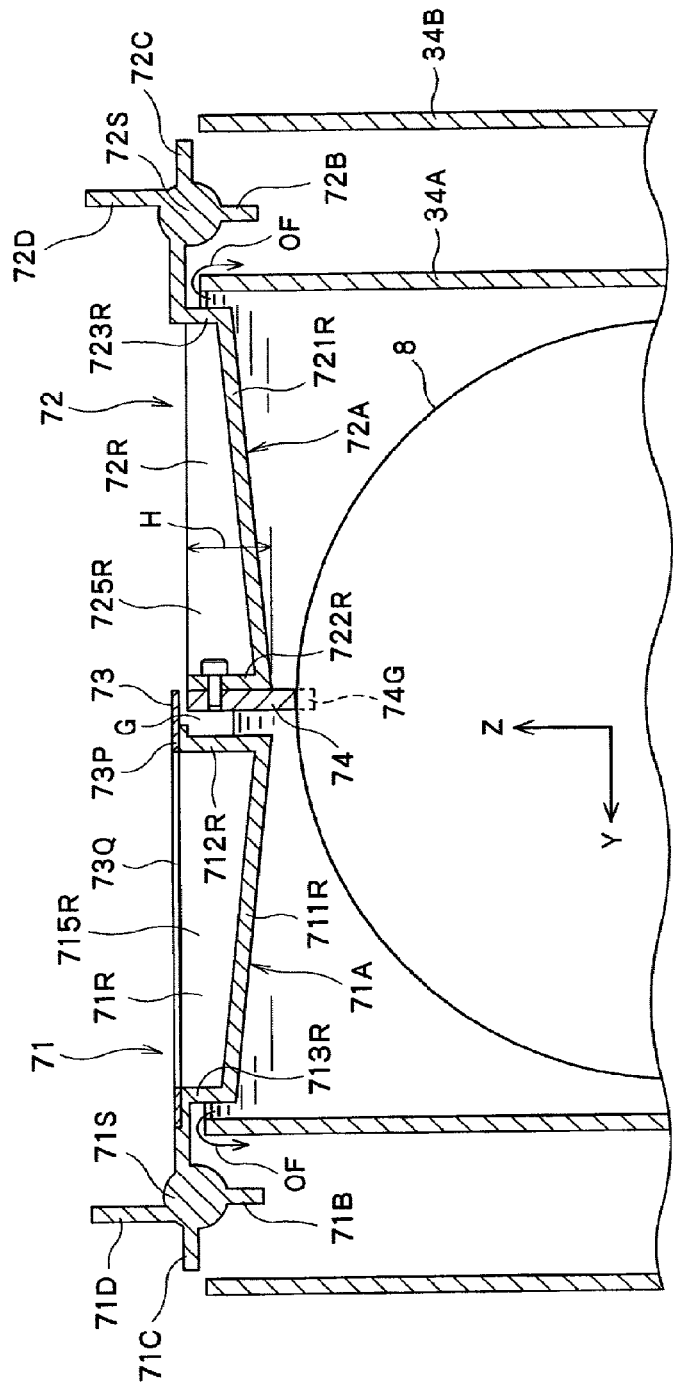
FIG. 6 is a detailed longitudinal sectional view of the processing tub, illustrating only a cover body located at a closing position and components therearound.
Figure 7:
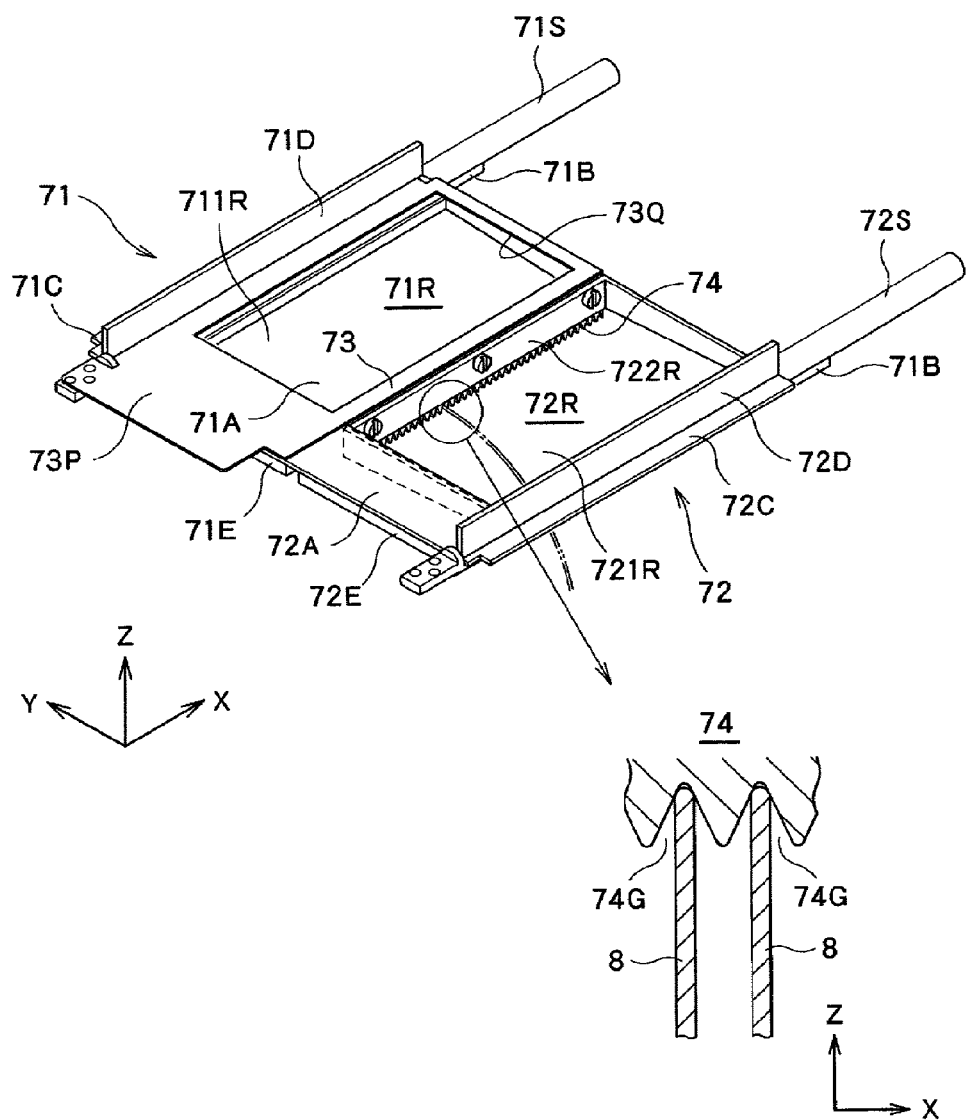
FIG. 7 is a perspective view of the cover body.

As depicted in FIG. 6, when the first cover body 71 and the second cover body 72 are placed at the closing positions, the sidewall 712R extended upwards from the bottom wall 711R of the first cover body 71 and the sidewall 722R extended upwards from the bottom wall 721R of the second cover body 72 face each other, and a gap G having a height H is provided between these two sidewalls. By providing the recesses 71R and 72R, an increase of a weight of the first cover body 71 and the second cover body 72 that might be caused by providing the gap of the height H can be suppressed.

As shown in FIG. 6, in case that a bottom surface of the main body 71A of the first cover body 71 (that is, a bottom surface of the bottom wall 711R) and a bottom surface of the main body 72A of the second cover body 72 (that is, a bottom surface of the bottom wall 721R) are in contact with the liquid surface of the processing liquid within the inner tub 34A, the boiling phosphoric acid aqueous solution may be sprayed out from the gap between the first cover body 71 and the second cover body 72 to be scattered around. However, by providing the gap G of the height H as described above, it becomes difficult for the boiling processing liquid from being splashed out from the gap G. To achieve this effect, the height H may be set to be, but not limited to, equal to or larger than 5 cm.

If the processing liquid within the inner tub 34A is the phosphoric acid aqueous solution which is in the boiling state, at least the main bodies 71A and 72A of the first and second cover bodies 71 and 72 may be made of a material which is not damaged by the processing liquid, for example, quartz. In case that the main bodies 71A and 72A are made of quartz, these two quart quartz members may be broken or distorted by colliding with each other. To prevent this problem, it is desirable to provide a gap between the main bodies 71A and 72A so that the main bodies 71A and 72A do not come into contact with each other when the first cover body 71 and the second cover body 72 are placed at the closing positions. If the gap is provided between the main bodies 71A and 72A, the phosphoric acid aqueous solution within the processing tub 34, particularly, within the inner tub 34A may be splashed out through this gap. By providing the aforementioned gap G of the height H, however, the splashing of the phosphoric acid aqueous solution from the gap G can be greatly suppressed at least.

Further, in a case that the bottom wall 711R (721R) is inclined as stated above and put into contact with the phosphoric acid aqueous solution within the inner tub 34A to smoothly perform the overflow, a leading end of the bottom wall 711R (721R) may be immerged in the phosphoric acid aqueous solution if the sidewall 712R (722R) which is extended upwards from the sidewall 711 (721R) is not provided. However, by providing the sidewall 712R (722R) extended upwards from the bottom wall 711R (721R) as stated above, a height position of the liquid surface of the phosphoric acid aqueous solution can be set to be lower than an upper end of the sidewall 712R (722R).

As illustrated in FIG. 6, desirably, one of the main body 71A of the first cover body 71 and the main body 72A of the second cover body 72 (here, the main body 71A) may be equipped with a cover 73 which is extended to or beyond above a leading end of the other of the main body 71A and the main body 72A (here, the main body 72A) and covers the gap G from above. By providing this cover 73, an upward spray of the processing liquid from the gap G can be suppressed. Further, in FIG. 3 to FIG. 5, the cover 73 (and a plate-shaped body 73P) is not shown for the simplicity of illustration.

Furthermore, since the gap G has the height H, a force of liquid droplets of the processing liquid splashed from the liquid surface of the phosphoric acid aqueous solution within the inner tub 34A is weakened by the time when they collide with the cover 73. Therefore, the processing liquid having collided with the cover 73 may not be splashed sideways.

As illustrated in FIG. 6, for example, the cover 73 may be prepared by mounting, on the top surface of the main body 71A of the first cover body 71, the plate-shaped body 73P having a substantially rectangular cutout portion 73Q corresponding to a contour of the recess 71R of the first cover body 71. In this case, the cover 73 is implemented by a periphery portion of the plate-shaped body 73P.

As shown in FIG. 6, when the first cover body 71 and the second cover body 72 are located at the closing positions, there may be provided a gap between the cover 73 and the second cover body 72. Instead, when the first cover body 71 and the second cover body 72 are placed at the closing positions, the cover 73 and the second cover body 72 may be in contact with each other. In this case, the cover 73 serves as a seal configured to shield an upper end portion of the gap G.

In the configuration in which the cover 73 is contact with the second cover body 72, it may be desirable that the cover 73 is made of a resin material which is hardly damaged even when being collided with the quartz, has enough flexibility not to damage the quartz and has relatively high corrosion resistance. By way of non-limiting example, the cover 73 may be made of a fluorine-based resin material such as PTFE or PFA.

The cover 73 may be formed as one body with the first cover body 71. Further, the cover 73 may not be provided. In case that the cover 73 is not provided, it is desirable to set the height H to be larger than that in case that the cover 73 is provided.

In addition, a substrate pressing member 74 may be provided at one of the main body 71A of the first cover body 71 or the main body 72A of the second cover body 72 (here, at a leading end portion of the main body 72A of the second cover body 72). Formed on a bottom surface of the substrate pressing member 74 are multiple substrate holding grooves 74G, which are arranged at the same X-directional positions as the substrate supporting grooves (not shown) of the substrate supporting member 36B at the same pitch as that of the substrate supporting grooves 74G along the arrangement direction (X-direction) of the substrates 8. A peripheral portion of a single sheet of substrate 8 is accommodated in each of the substrate holding grooves 74G. Further, in FIG. 7, though a lower end portion of the substrate holding member 74 (where the substrate holding grooves 74G are formed) is seen, this lower end portion is actually hidden behind the bottom wall 721R of the recess 72R and is not seen.

In the illustrated exemplary embodiment, the substrate pressing member 74 is implemented by a narrow long plate-shaped body formed separately from the second cover body 72, and is fixed to the main body 72A of the second cover body 72 by screwing. Instead, the substrate pressing member 74 may be formed as one body with the second cover member 72. In any cases, the substrate pressing member 74 forms a part of the sidewall 722R of the main body 72A of the second cover body 72.

While the substrates 8 are being processed, the substrate pressing member 74 provided at the second cover body 72 located at the closing position is engaged with the substrates 8 supported by the substrate supporting member 36B to prevent or suppress an upward displacement of the corresponding substrates 8. Therefore, even if the processing liquid is discharged from the processing liquid supply nozzle 49 at a large flow rate, the boiling level of the processing liquid within the inner tub 34A is increased, or the bubbling of the nitrogen gas is strongly performed, there is no concern that the substrates 8 may be separated from the substrate supporting member 36B.

Now, an operation of the above-described etching apparatus 1 will be discussed. First, the phosphoric acid aqueous solution supply unit 40 supplies the phosphoric acid aqueous solution into the outer tub 34B of the liquid processing unit 39. With a lapse of a preset time after the beginning of the supply of the phosphoric acid aqueous solution, the pump 51 of the circulation line 50 is operated, so that the circulation flow circulated within the above-described circulation system is generated.

Further, the heater 52 of the circulation line 50 is operated to heat the phosphoric acid aqueous solution such that the phosphoric acid aqueous solution within the inner tub 34A reaches a predetermined temperature (e.g., 160° C.). The first cover body 71 and the second cover body 72 are moved to the closing positions until the time when the heating by the heater 52 is begun. The phosphoric acid aqueous solution whose temperature has reached 160° C. comes into a boiling state. If it is detected by the phosphoric acid concentration meter 55 that the phosphoric acid concentration exceeds a preset upper limit due to the evaporation of the moisture by the boiling, the pure water is supplied from the pure water supply unit 41.

Before the substrates 8 corresponding to the single lot are put into the phosphoric acid aqueous solution within the inner tub 34A, the silicon concentration in the phosphoric acid aqueous solution within the circulation system (including the inner tub 34A, the outer tub 34B and the circulation line 50) (this silicon concentration affects the etching selectivity for the silicon nitride film with respect to the silicon oxide film) is adjusted. The adjustment of the silicon concentration may be performed by immersing a dummy substrate in the phosphoric acid aqueous solution within the inner tub 34A or by supplying the silicon-containing compound aqueous solution into the outer tub 34B from the silicon supply unit 42. To confirm the silicon concentration in the phosphoric acid aqueous solution within the circulation system falls within a preset concentration range, the phosphoric acid aqueous solution may be flown into the drain line 43A and then the silicon concentration may be measured by the silicon concentration meter 43G.

After the completion of the adjustment of the silicon concentration, the first cover body 71 and the second cover body 72 are respectively moved to the opening positions, and the multiplicity of substrates 8 held by the substrate elevating device 36, that is, the multiplicity (for example, 50 sheets) of substrates 8 forming a single lot (called a processing lot or a batch) are immersed in the phosphoric acid aqueous solution within the inner tub 34A. Thereafter, the first cover body 71 and the second cover body 72 are immediately returned to the closing positions. By immersing the substrates 8 in the phosphoric acid aqueous solution for a preset time period, a wet etching processing (liquid processing) is performed on the substrates 8.

By placing the first cover body 61 and the second cover body 62 at the closing positions during the etching processing of the substrates 8, the temperature decrease in the vicinity of the liquid surface of the phosphoric acid aqueous solution within the inner tub 34A is suppressed, and, accordingly, the temperature distribution of the phosphoric acid aqueous solution within the inner tub 34A can be suppressed to be small. Further, since the inner tub 34A is immersed in the phosphoric acid aqueous solution within the outer tub 34B, the temperature decrease of the phosphoric acid aqueous solution within the inner tub 34A, which is caused by the heat radiation from the walls of the inner tub 34A, can be suppressed and the temperature distribution of the phosphoric acid aqueous solution within the inner tub 34A can also be suppressed to be small. Therefore, the uniformity of the etching amount within the surface of the substrate 8 and between the surfaces of the substrates 8 can be improved.

Since the silicon is eluted from the substrates 8 during the processing of the substrates 8 corresponding to the single lot, the silicon concentration in the phosphoric acid aqueous solution within the circulation system is increased. To maintain constant or change intentionally the silicon concentration in the phosphoric acid aqueous solution within the circulation system during the processing of the substrates 8, the phosphoric acid aqueous solution can be supplied by the phosphoric acid aqueous solution supply unit 40 while draining the phosphoric acid aqueous solution within the circulation system by the phosphoric acid aqueous solution drain unit 43.

If the processing upon the substrates 8 of the single lot is completed as stated above, the first cover body 71 and the second cover body 72 are moved to the opening positions, and the substrates 8 are carried out from the inner tub 34A.

Then, the first cover body 71 and the second cover body 72 are moved to the closing positions, and after the adjustment of the temperature, the phosphoric acid concentration and the silicon concentration of the phosphoric acid aqueous solution within the circulation system, the processing of substrates 8 of another lot is performed in the same manner as described above.

In the above-described exemplary embodiment, though the phosphoric acid aqueous solution is used as the processing liquid, the exemplary embodiment is not limited thereto. By way of example, a processing liquid prepared by mixing an additive such as acetic acid or the like into SC1 or the phosphoric acid aqueous solution may be used. Further, though the silicon nitride film is the etching target in the above exemplary embodiment, the exemplary embodiment is not limited thereto, and the etching target may be another film. Besides, the processing performed on the substrates within the processing tub may not include the etching processing but include only the cleaning processing. That is, the exemplary embodiment can be applied when performing a processing in the processing tub under a condition that a spray occurs from the liquid surface of the processing liquid. The substrate is not limited to the semiconductor wafer and may be one made of another material such as glass ceramic, or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate liquid processing apparatus, comprising:
an inner tub, having a top opening, configured to store a processing liquid therein;
an outer tub provided at an outside of the inner tub and configured to receive the processing liquid flowed from the inner tub;
a first cover body configured to be moved between a first closing position where the first cover body closes a first region of the top opening of the inner tub and a first opening position where the first cover body opens the first region of the top opening; and
a second cover body configured to be moved between a second closing position where the second cover body closes a second region of the top opening of the inner tub and a second opening position where the second cover body opens the second region of the top opening,
wherein the first cover body has a bottom wall, the bottom wall having a bottom surface and an opposing top surface, and a sidewall extending upwards from the top surface of the bottom wall, the sidewall having an inner surface and an opposing outer surface,
the second cover body has a bottom wall, the bottom wall of the second cover body having a bottom surface and an opposing top surface, and a sidewall extending upwards from the top surface of the bottom wall of the second cover body, the sidewall of the second cover body having an inner surface and an opposing outer surface, and
when the first cover body and the second cover body are respectively placed at the first and second closing positions, the sidewall of the first cover body and the sidewall of the second cover body are closely located such that the inner surfaces of the sidewalls face each other with a gap having a height therebetween,
the gap is defined between the sidewall of the first cover body and the sidewall of the second cover body, and
wherein a first recess is formed in a top portion of the first cover body the first recess having a bottom defined by the top surface of the bottom wall of the first cover body and a side defined by the outer surface of the sidewall of the first cover body, and
a second recess is formed in a top portion of the second cover body, the second recess having a bottom defined by the top surface of the bottom wall of the second cover body and a side defined by the outer surface of the sidewall of the second cover body.

2. The substrate liquid processing apparatus of claim 1, wherein the bottom wall of the first cover body and the bottom wall of the second cover body are inclined vertically downward toward a center of the inner tub.

3. The substrate liquid processing apparatus of claim 1, wherein a cover configured to cover the gap from above is provided at at least one of the first cover body or the second cover body.

4. The substrate liquid processing apparatus of claim 3, wherein a plate-shaped body is mounted to a top surface of the at least one of the first cover body or the second cover body where the cover is provided, and the plate-shaped body is part of the cover and is protruded above the gap over the corresponding sidewall.

5. The substrate liquid processing apparatus of claim 1, wherein a seal configured to seal the gap is provided at at least one of the first cover body or the second cover body.

6. The substrate liquid processing apparatus of claim 5, wherein a material forming the seal has higher flexibility than a material forming the first cover body and the second cover body.

7. The substrate liquid processing apparatus of claim 6, wherein the material forming the first cover body and the second cover body is quartz, and the material forming the seal is a fluorine-based resin.

8. The substrate liquid processing apparatus of claim 6, wherein a plate-shaped body is mounted to a top surface of the at least one of the first cover body or the second cover body where the seal is provided, and the plate-shaped body is part of the seal and is protruded above the gap from the corresponding sidewall.

9. The substrate liquid processing apparatus of claim 1, wherein when the first cover body and the second cover body are respectively located at the first and second closing positions, bottom surfaces of the bottom walls of the first cover body and the second cover body are in contact with a liquid surface of the processing liquid within the inner tub while the processing liquid is being overflowed from the inner tub into the outer tub.

10. The substrate liquid processing apparatus of claim 4, wherein the cover extends from the sidewall of one of the first cover body and the second cover body past the outer surface of the sidewall of the other of the first cover body and the second cover body.

11. A substrate liquid processing apparatus, comprising:
an inner tub, having a top opening, configured to store a processing liquid therein; an outer tub provided at an outside of the inner tub and configured to receive the processing liquid flowed from the inner tub;
a first cover body configured to be moved between a first closing position where the first cover body closes a first region of the top opening of the inner tub and a first opening position where the first cover body opens the first region of the top opening; and
a second cover body configured to be moved between a second closing position where the second cover body closes a second region of the top opening of the inner tub and a second opening position where the second cover body opens the second region of the top opening, wherein the first cover body has a bottom wall, the bottom wall having a bottom surface and an opposing top surface, and a sidewall extending upwards from the top surface of the bottom wall, the sidewall having an inner surface and an opposing outer surface, the second cover body has a bottom wall, the bottom wall of the second cover body having a bottom surface and an opposing top surface, and a sidewall extending upwards from the top surface of the bottom wall of the second cover body, the sidewall of the second cover body having an inner surface and an opposing outer surface, and when the first cover body and the second cover body are respectively placed at the first and second closing positions, the sidewall of the first cover body and the sidewall of the second cover body are closely located such that the inner surfaces of the sidewalls face each other with a gap having a height therebetween, the gap is defined between the sidewall of the first cover body and the sidewall of the second cover body, and a cover extends from the first cover body beyond a leading end of the second cover body to cover the gap from above, wherein a first recess is formed in a top portion of the first cover body, the first recess having a bottom defined by the top surface of the bottom wall of the first cover body and a side defined by the outer surface of the sidewall of the first cover body, and a second recess is formed in a top portion of the second cover body, the second recess having a bottom defined by the top surface of the bottom wall of the second cover body and a side defined by the outer surface of the sidewall of the second cover body.

12. The substrate liquid processing apparatus of claim 11, wherein a plate-shaped body is mounted to the top surface of the first cover body and the plate-shaped body is part of the cover and is protruded above the gap over the corresponding sidewall.

* * * * *

UNITED STATES PATENT AND TRADEMARK OFFICE
CERTIFICATE OF CORRECTION

PATENT NO. : 11,637,026 B2
APPLICATION NO. : 16/150513
DATED : April 25, 2023
INVENTOR(S) : Hiroyuki Masutomi et al.

It is certified that error appears in the above-identified patent and that said Letters Patent is hereby corrected as shown below:

In the Specification

Column 11, Line 62, "two quart quartz members" should be -- two quartz members --.

Signed and Sealed this
Thirtieth Day of January, 2024

Katherine Kelly Vidal
*Director of the United States Patent and Trademark Office*